(12) United States Patent
Yang et al.

(10) Patent No.: US 9,943,000 B2
(45) Date of Patent: Apr. 10, 2018

(54) POWER MODULE AND POINT-OF-LOAD (POL) POWER MODULE

(71) Applicant: DELTA ELECTRONICS (SHANGHAI) CO., LTD., Shanghai (CN)

(72) Inventors: Haijun Yang, Shanghai (CN); Zengyi Lu, Shanghai (CN); Yuyang Jiang, Shanghai (CN); Xiangxing Zheng, Shanghai (CN); Yunyun Gao, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 86 days.

(21) Appl. No.: 14/604,073

(22) Filed: Jan. 23, 2015

(65) Prior Publication Data
US 2015/0282370 A1    Oct. 1, 2015

(30) Foreign Application Priority Data

Apr. 1, 2014    (CN) .......................... 2014 1 0130120

(51) Int. Cl.
*H01F 5/00*    (2006.01)
*H05K 7/14*    (2006.01)
(Continued)

(52) U.S. Cl.
CPC .............. *H05K 7/1432* (2013.01); *H01F 5/00* (2013.01); *H01L 23/645* (2013.01); *H01L 25/07* (2013.01); *H01L 2924/0002* (2013.01)

(58) Field of Classification Search
CPC ........................ H01F 5/00; H01F 27/00–27/36
(Continued)

(56) References Cited

U.S. PATENT DOCUMENTS 5,179,365 A * 1/1993 Raggi ................. H01F 27/2804
336/192
5,521,573 A * 5/1996 Inoh .................... H01F 27/2804
336/180
(Continued)

FOREIGN PATENT DOCUMENTS

CN         1457629 A    11/2003
CN       101620916 A     1/2010
(Continued)

OTHER PUBLICATIONS

1st Office Action dated Mar. 1, 2017 by the CN Office.
2nd OA dated Jun. 2, 2017, in the corresponding CN Application, by the SIPO.

*Primary Examiner* — Tuyen Nguyen
(74) *Attorney, Agent, or Firm* — Yunling Ren (57) ABSTRACT

The present invention relates to a power module and a POL power module. The power module comprises an inductor and a main board; the inductor is disposed on the main board and includes an upper magnetic core, a PCB winding board, pins and a lower magnetic core; the PCB winding board is disposed between the upper magnetic core and the lower magnetic core; first ends of the pins are connected to the PCB winding board; and a second end, opposite to the first end, of at least one pin is extended and exceeds the bottom surface of the lower magnetic core, and is connected to the main board, so that a receiving space is formed between the bottom surface of the lower magnetic core and an upper surface of the main board. The power module of the application can provide at least two low-power independent outputs and can also provide high-power outputs in in-phase or interleaved parallel connection. Moreover, due to the new decoupled integrated floating inductor design, the objectives of miniaturization and high power density of the power (Continued)

module can be achieved, and the optimal layout of other electronic components can be conveniently realized.

15 Claims, 8 Drawing Sheets

(51) Int. Cl.
 *H01L 23/64* (2006.01)
 *H01L 25/07* (2006.01)
(58) Field of Classification Search
 USPC ............ 336/65, 83, 192, 200, 220–223, 232
 See application file for complete search history.

(56) References Cited

U.S. PATENT DOCUMENTS

| | | | | |
|---|---|---|---|---|
| 5,724,016 A | * | 3/1998 | Roessler | ............. H01F 27/2804 336/192 |
| 6,000,128 A | * | 12/1999 | Umeno | ............... H01F 27/2804 29/605 |
| 6,239,683 B1 | * | 5/2001 | Roessler | ............. H01F 27/2804 336/200 |
| 6,628,531 B2 | * | 9/2003 | Dadafshar | ........... H01F 17/0013 336/200 |
| 6,778,405 B2 | | 8/2004 | Boylan et al. | |
| 6,912,134 B2 | | 6/2005 | Grant et al. | |
| 8,054,633 B2 | | 11/2011 | Suwa et al. | |

FOREIGN PATENT DOCUMENTS

| | | | |
|---|---|---|---|
| CN | 102360787 A | | 2/2012 |
| CN | 202678076 U | * | 1/2013 |
| CN | 203444945 U | | 2/2014 |
| CN | 203503447 U | | 3/2014 |

\* cited by examiner

POWER MODULE AND POINT-OF-LOAD (POL) POWER MODULE

CROSS-REFERENCE TO RELATED APPLICATIONS

This application claims the benefit of Chinese Patent Application No. 201410130120.3 filed on Apr. 1, 2014 in the State Intellectual Property Office of China, the application of which is incorporated herein by reference in its entirety.

TECHNICAL FIELD

The present invention relates to a power module and a point-of-load (POL) power module.

BACKGROUND ART

With the development of semiconductor technology, packaging technology and the like, the power density of power modules is increasingly larger and the conversion efficiency is increasingly higher, and hence the reasonable and effective layout of various components on a printed circuit board (PCB) is more and more important. A power system tends to need a plurality of independent DC-DC power modules and various modules are required to not only output independently but also operate in parallel. POL power module is one of the DC-DC power modules. As the modular layout has a plurality advantages, the power module is widely applied in the communication field such as interchangeable equipment, access equipment, mobile communication, microwave communication, optical transmission and router and the fields such as automotive electronics and aerospace. An inductor element usually has largest volume and heaviest weight in the DC-DC power module, so that the structure and the layout of the inductor can directly have effect on the positions of other components.

How to design a DC-DC power module with high efficiency and reasonable device layout becomes one of the most important problems to be solved currently.

SUMMARY OF DISCLOSURE

One of the Problems to be Solved

Due to the continuous pursuit of high power density and high performance of a power system, the present invention provides a power module adopting a decoupled integrated floating inductor design to achieve the objectives of miniaturization, high power density and high efficiency of the power module.

One of the Technical Solutions

The present invention provides a power module, which comprises an inductor and a main board. The inductor is disposed on the main board and includes an upper magnetic core, a PCB winding board, pins and a lower magnetic core; the PCB winding board is disposed between the upper magnetic core and the lower magnetic core; first ends of the pins are connected to the PCB winding board; and a second end, opposite to the first end, of at least one pin is extended and exceeds the bottom surface of the lower magnetic core and is connected to the main board, and hence a receiving space is formed between the bottom surface of the lower magnetic core and an upper surface of the main board.

The present invention further provides a POL power module, which comprises: a plurality of Buck circuits and a main board. Each Buck circuit includes an inductor; the plurality of inductors are integrated into an integrated inductor module which including an upper magnetic core, a PCB winding board, pins and a lower magnetic core; the PCB winding board is disposed between the upper magnetic core and the lower magnetic core; first ends of the pins are connected to the PCB winding board; the lower magnetic core at least includes a first winding column, a second winding column and a common magnetic column disposed between the first winding column and the second winding column; the PCB winding board includes at least one first winding and at least one second winding; the first winding is disposed on the first winding column to form a first inductor, and the second winding is disposed on the second winding column to form a second inductor; and a main board, the integrated inductor module is disposed on the main board; and a second end, opposite to the first end, of at least one pin is extended and exceeds the bottom surface of the lower magnetic core and is connected to the main board, hence a receiving space is formed between the bottom surface of the lower magnetic core and an upper surface of the main board.

One of the Beneficial Effects

The power module of the application can provide at least two independent low-power outputs and can also provide high-power outputs in in-phase or interleaved parallel connection. In addition, due to the new decoupled integrated floating inductor design, the objectives of miniaturization and high power density of the power module can be achieved, and the optimal layout of other components can be conveniently realized. Moreover, according to the application, the assembly of the upper magnetic core and the lower magnetic core of the inductor can be more stable, and hence the deviation of the inductance of various integrated inductors can be basically eliminated.

BRIEF DESCRIPTION OF THE DRAWINGS

Further description will be given to the present invention with the accompanying drawings. The accompanying drawings are incorporated in and constitute a part of the application. The preferred embodiments of the present invention and the description are configured to illustrate the principle of the present invention.

In the figures.

DETAILED DESCRIPTION

A plurality of preferred embodiments will be further described below and not intended to limit the application to the specifically disclosed combinations. Therefore, unless otherwise indicated, a plurality of features disclosed herein can be combined to form various other combinations not illustrated due to the objective of briefness.

In an embodiment, the power module of the application can provide at least two independent low-power outputs and can also provide at least one high-power output by connecting the plurality of low-power outputs in parallel. Moreover, due to the new decoupled integrated floating inductor design of the application, one of the objectives of miniaturization and high power density of the power module can be achieved. More specifically, the following illustrative preferred embodiments will be described below.

Figure 1:
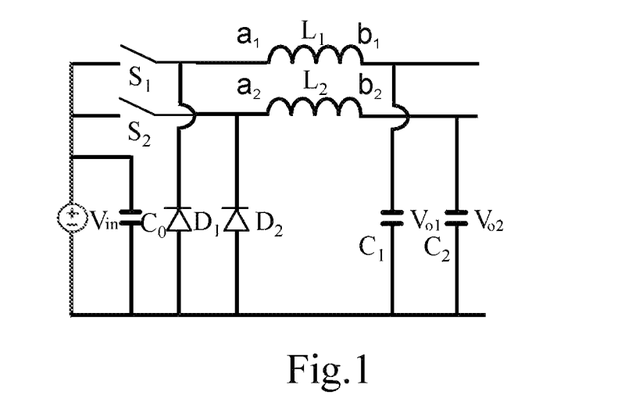
FIG. 1 is a schematic diagram of a circuit of a power module according to the embodiment of the present invention.
Figure 2:
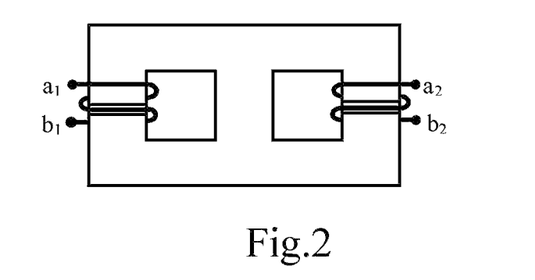
FIG. 2 is a schematic diagram of an inductor of the power module according to the embodiment of the present invention.

As illustrated in FIG. 1, in an embodiment, the POL power module comprises a main power circuit formed by two Buck circuits; each Buck circuit includes an input capacitor C0, a high side MOSFET S1 (or S2), a low side switch D1 (or D2, a diode is illustrated in the figure and a synchronous rectifier switch may also be adopted), an output inductor L1 (or L2) and an output filter capacitor C1 (or C2). According to one embodiment as shown in FIG. 1, the power module comprises two Buck circuits. Of course, as for those skilled in the art, the power module may also comprise more than two Buck circuits, may also be achieved by other circuits, and may be a POL power module and may also be a power module with other function. In an embodiment, by cooperating with an externally or internally arranged control unit, a power module can provide at least two independent POL outputs to satisfy the requirement of low-power application, and also can provide a higher-power POL output by means of in-phase or interleaved parallel connection to satisfy the requirement of higher-power application. Moreover, in an embodiment, in order to integrally reduce the volume of the power module and guarantee the original independent function, the inductors of the present invention adopt the decoupled integrated floating solution to dispose two inductors on a magnetic core. FIG. 2 is a schematic diagram illustrating the process of integrating two inductors as shown in FIG. 1 into an integrated inductor module.

Figure 3:
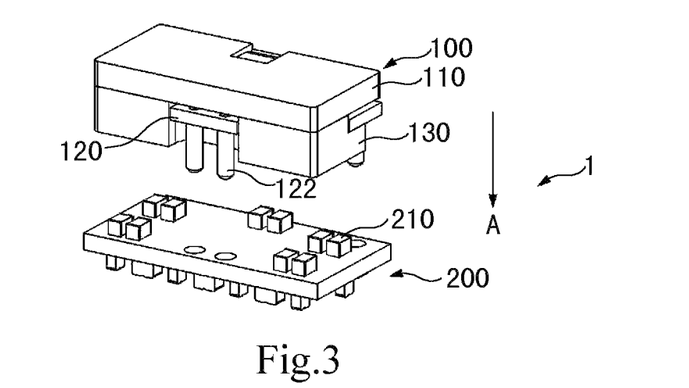
FIG. 3 is an exploded perspective view of the power module according to the embodiment of the present invention.

FIG. 3 illustrates a power module 1 according to one embodiment of the present invention. The power module 1 comprises an inductor 100 and a main board 200, wherein the inductor 100 is disposed on the main board 200. Moreover, the inductor 100 provided by the embodiment includes an upper magnetic core 110 and a lower magnetic core 130; a PCB winding board 120 is sandwiched between the upper magnetic core 110 and the lower magnetic core 130, and pins 122 are provided on the PCB winding board 120. The pins 122 are connected with the main board 200, in one embodiment, the pins 122 are to achieve the electrical connection between the PCB winding board 120 and electronic components 210 on the main board 200. As illustrated in FIG. 3, the number of pins 122 is four, namely two pairs of pins for forming pins of two inductors respectively. Moreover, the pins 122 are extended downwards (the direction shown by the arrowhead A in FIG. 3 is the downward direction) from the PCB winding board 120 and exceed a bottom surface of the lower magnetic core 130, and hence the inductor 100 has a floating inductor structure when the whole inductor 100 is connected to the main board 200, namely a receiving space is formed between the bottom surface of the lower magnetic core 130 of the inductor 100 and an upper surface of the main board 200. In this case, the electronic components 210 on the main board 200 can be distributed in the receiving space, and hence the effective utilization of space and the optimal layout of other components can be achieved.

Figure 4:
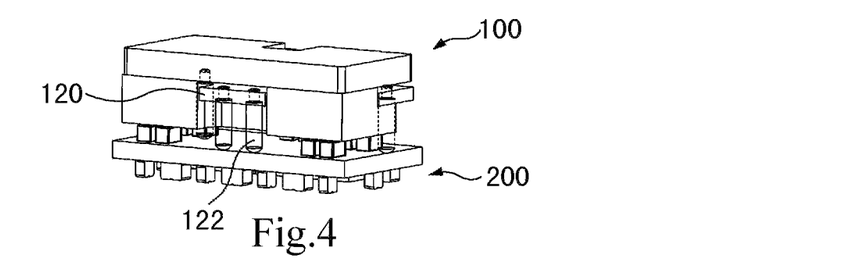
FIGS. 4 to 12 are schematic diagrams of the power module according to the embodiment of the present invention, illustrating different cases of the connection between the pins and the PCB winding board and the main board.
Figure 5:
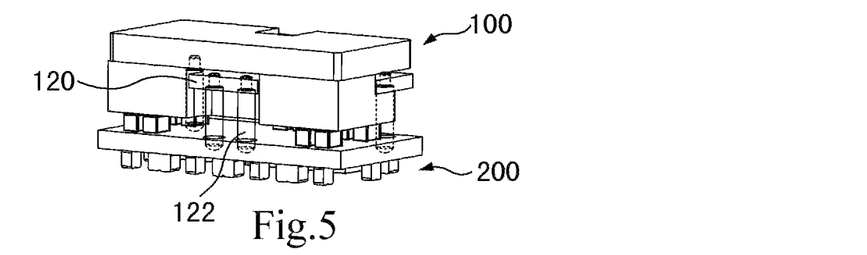
Figure 6:
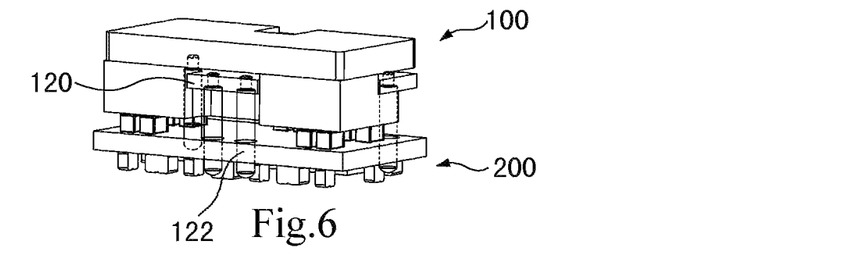
Figure 7:
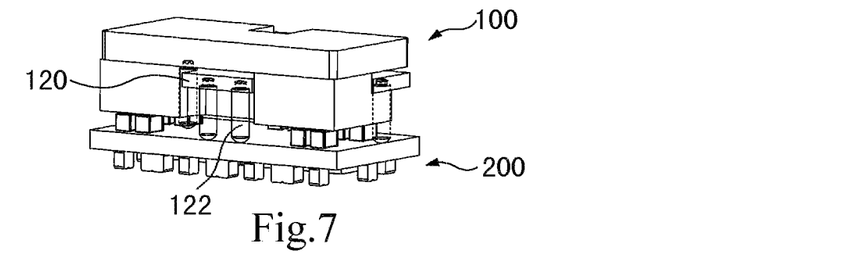
Figure 8:
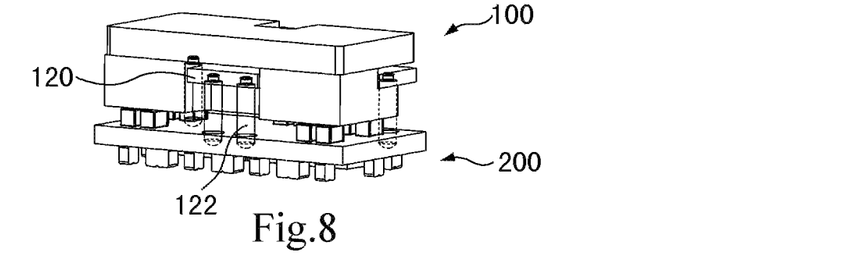
Figure 9:
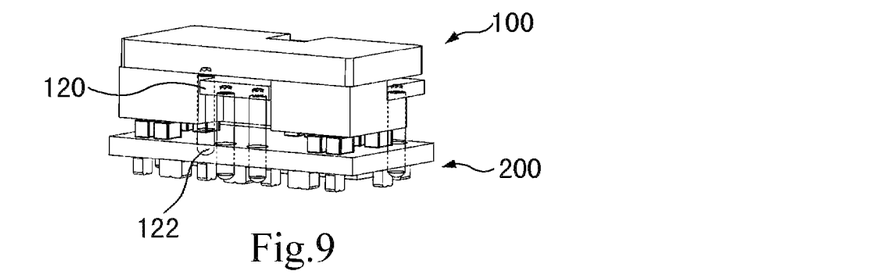
Figure 10:
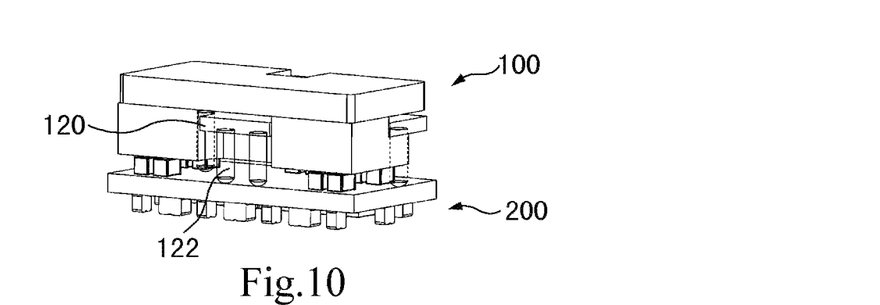
Figure 11:
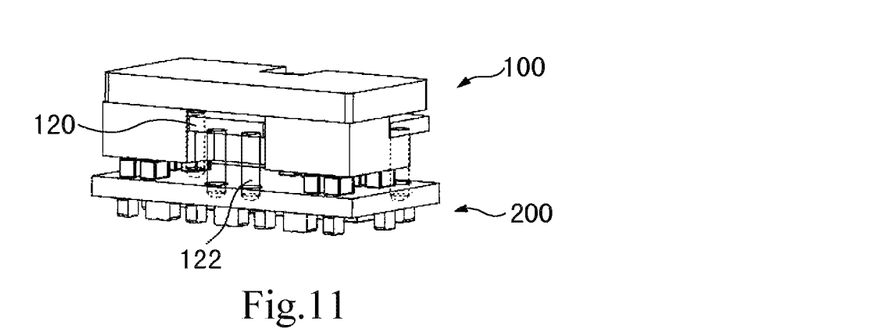
Figure 12:
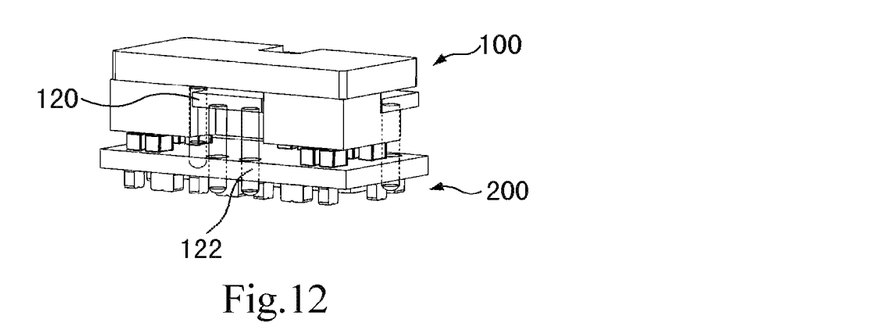

FIGS. 4 to 12 are schematic diagrams of the power module according to an embodiment of the present invention, illustrating different cases of the connection between the pins 122 and the PCB winding board 120 and the main board 200. As illustrated in FIG. 4, one end of the pins 122 are disposed in through holes of the PCB winding board 120 and the other end of the pin 122 are surface mounted on the main board 200. As illustrated in FIG. 5, one end of the pins 122 are disposed in the through holes of the PCB winding board 120 and the other end of the pins 122 are disposed in blind holes of the main board 200. As illustrated in FIG. 6, one end of the pins 122 are disposed in the through holes of the PCB winding board 120 and the other end of the pins 122 are disposed in through holes of the main board 200. As illustrated in FIG. 7, one end of the pins 122 are disposed in blind holes of the PCB winding board 120 and the other end of the pins 122 are surface mounted on the main board 200. As illustrated in FIG. 8, one end of the pins 122 are disposed in the blind holes of the PCB winding board 120 and the other end of the pins 122 are disposed in the blind holes of the main board 200. As illustrated in FIG. 9, one end of the pins 122 are disposed in the blind holes of the PCB winding board 120 and the other end of the pins 122 are disposed in the through holes of the main board 200. As illustrated in FIG. 10, one end of the pins 122 are surface mounted on the PCB winding board 120 and the other end of the pins 122 are also surface mounted on the main board 200. As illustrated in FIG. 11, one end of the pins 122 are surface mounted on the PCB winding board 120 and the other end of the pins 122 are disposed in the blind holes of the main board 200. As illustrated in FIG. 12, one end of the pins 122 are surface mounted on the PCB winding board 120 and the other end of the pins 122 are disposed in the through holes of the main board 200.

The case that only four pins 122 are formed has been described above, namely the four pins 122 are usually independent metal pins and configured to achieve the electrical connection between the PCB winding board 120 and the electronic components 210 on the main board 200. According to another embodiment of the application, a plurality of pins 122 may also be included, namely not only the four metal pins 122 for achieving electrical connection are included but also other support pins for supporting the inductors are also included. The support pins may be made of metal, plastics or other materials. At least one metal pin or at least one support pin is extended downwards and exceeds the bottom surface of the lower magnetic core 130, so that the inductor 100 can be floated. Lower ends of the metal pins or the support pins (the ends which connected to the main board 200) may be disposed in the same plane and may also not. The PCB winding board 120 and the main board 200 may be parallel to each other or may not be. Moreover, the receiving space may be adjusted by the adjustment of the length of the pins.

One of the specific structures of the inductor and the lower magnetic core will be further described below.

Figure 13:
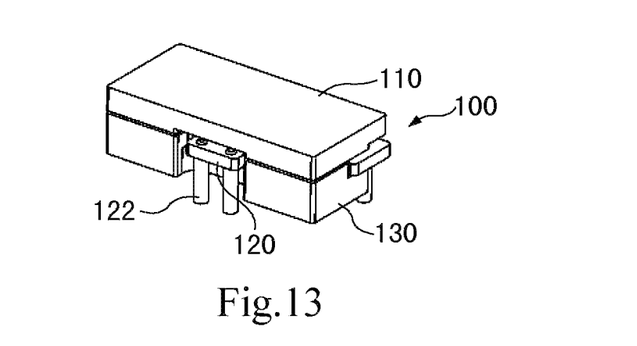
FIG. 13 is a schematic diagram of an inductor according to an embodiment of the present invention.
Figure 14:
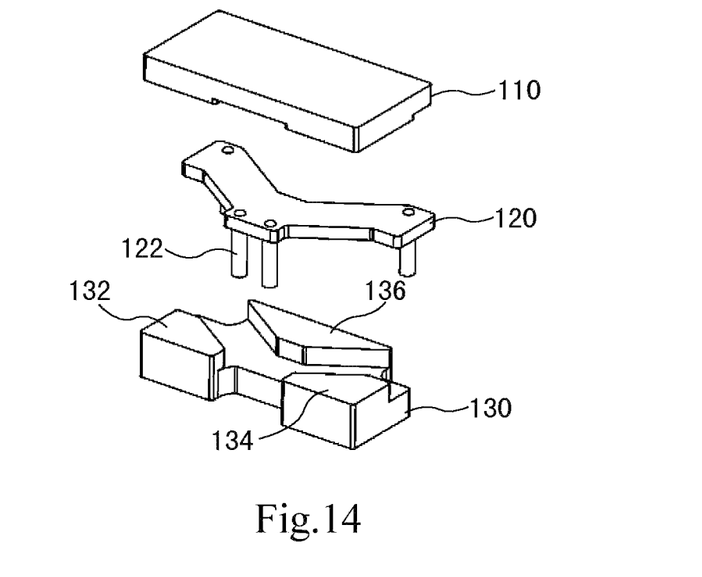
FIG. 14 is a schematic exploded view of the inductor according to the embodiment of the present invention.

FIGS. 13 and 14 illustrate one embodiment of the specific structures of the inductor 100. The inductor 100 includes an upper magnetic core 110, a lower magnetic core 130 and a PCB winding board 120 disposed between the upper magnetic core 110 and the lower magnetic core 130. The lower magnetic core 130 includes a first winding column 132, a second winding column 134 and a common magnetic column 136 disposed between the first winding column 132 and the second winding column 134. Windings of the PCB winding board 120 are respectively disposed on the first winding column 132 and the second winding column 134 to form two inductors which are integrated on one magnetic core. The upper magnetic core 110 is disposed on the lower magnetic core 130. The common magnetic column 136 supports the upper magnetic core 110 and forms parts of the magnetic circuits of the inductor. Two independent air gaps are respectively formed between the upper magnetic core 110 and the first winding column 132 and the second winding column 134.

Figure 15:
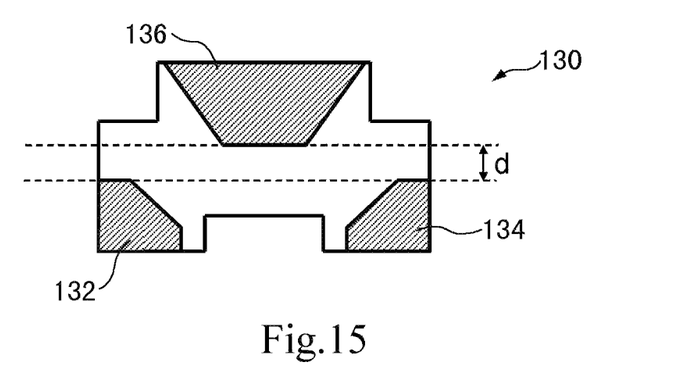
FIGS. 15 and 16 are schematic diagrams of a lower magnetic core according to the embodiment of the present invention.
Figure 16:
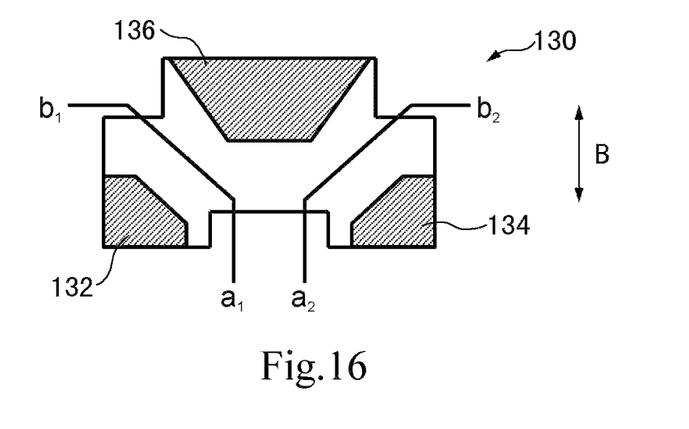

FIGS. 15 and 16 illustrate one embodiment of the structures of the lower magnetic core according to one embodiment of the application. The common magnetic column 136 disposed between the first winding column 132 and the second winding column 134 is trapezoidal. As illustrated in FIG. 14, two windings of the PCB winding board 120 are respectively disposed on the first winding column 132 and the second winding column 134; and when the upper magnetic core 110 is disposed on the lower magnetic core 130, a first air gap is formed between the first winding column 132 and the upper magnetic core 110 and a second air gap is formed between the second winding column 134 and the upper magnetic core 110. In one embodiment, in order to prevent the efficiency and the stable operation of the power module from being effected by the nonuniform current distribution in the case of parallel operation of two power circuits due to large deviation of the inductance value of two inductors, the area of the first winding column 132 is set to be equal to the area of the second winding column 134, and the height of the two air gaps is also set to be equal. In addition, in the embodiment, the area of the trapezoidal common magnetic column 136 is set to be bigger than the area of the first winding column 132 or the area of the second winding column 134. In one embodiment, two sloping sides of the common magnetic columns 136 are extended to the first winding column 132 and the second winding column 134, so that the height of the first air gap is equal to that of the second air gap on the basis of providing stable support for the upper magnetic core 110. In one embodiment , the area of the middle common magnetic column 136 is to be increased intendly so that part or all of the common magnetic column can be extended from the same side of the two air gap magnetic columns (along the direction shown by B in FIG. 16), and meanwhile one part of the common magnetic column 136 is formed to have extended trapezoidal structures in the direction of the first winding column 132 and the second winding column 134 (along the direction perpendicular to the direction shown by B in FIG. 16), so that the common magnetic column 136 can provide stable and reliable support for the upper magnetic core 110, and hence in one embodiment the inductance value of the two integrated inductors is stable and has small deviation, and consequently the uniform current distribution in the case of parallel operation can be achieved and the power module can operate stably and the efficiency can be improved.

According to an embodiment, along the longitudinal direction of the lower magnetic core 130 (the direction shown by the double-head arrow B in FIG. 16), the common magnetic column 136 is disposed on one side and the first winding column 132 and the second winding column 134 which are disposed on the opposite other side of the longitudinal direction. Therefore, the lower magnetic core 130 is integrally formed to be a Y-shaped magnetic core. In this case, as the middle common magnetic column 136 has the extended trapezoidal structures along the directions of the two air gap magnetic columns 132 and 134, the common magnetic column 136 can provide stable support for the upper magnetic core 110 and the height of the first air gap is equal to that of the second air gap. According to the application, in general, the deviation between the inductance value of the first inductor formed by the first winding column 132, the first air gap, the common magnetic column 136, the upper and lower magnetic covers and one of the windings of the PCB winding board 120 (a1, b1 in FIG. 16 is the first winding) and the inductance value of the second inductor formed by the second winding column 134, the second air gap, the common magnetic column 136, the upper and lower magnetic covers and the other winding of the PCB winding board 120 (a2, b2 in FIG. 16 is the second winding) may be controlled to be less than 10%, and preferably, may be 4% to 7%. More preferably, the inductance value of the first inductor may be equal to that of the second inductor. Therefore, when the two integrated inductors provided by the application operate in parallel, the current distribution can be more uniform, and hence the stable operation and higher efficiency of the power module can be guaranteed. Moreover, as illustrated in FIG. 15, along the longitudinal direction of the lower magnetic core 130, a predetermined distance d is formed between the common magnetic column 136 and the first winding column 132 and the second winding column 134. Preferably, the distance d is 1.2 mm, which is conducive to the passing of grinding equipment in the process of grinding the air gaps of the lower magnetic core 130.

As illustrated in FIGS. 15 and 16, along the transverse direction (the direction perpendicular to the direction shown by the double-head arrow B in FIG. 16) of the lower magnetic core 130, the common magnetic column 136 can provide stable support for the upper magnetic core 110, so that the seesaw phenomenon of the upper magnetic core 110 in the transverse direction can be avoided, and hence the height of the first air gap can be equal to that of the second air gap.

As an embodiment, the middle common magnetic column 136 may also be extended to or close to the side on which the first winding column 132 and the second winding column 134 are disposed. Therefore, the upper magnetic core 110 can be stably supported not only in the transverse direction but also in the longitudinal direction.

Figure 20:
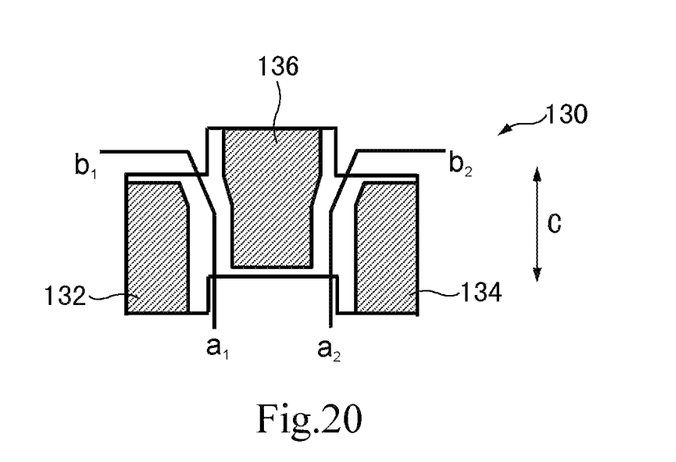

According to one embodiment, in the lower magnetic core 130, the common magnetic column 136 is disposed on one side of the longitudinal direction of the lower magnetic core 130 and the first winding column 132 and the second winding column 134 are disposed on the other side of the longitudinal direction of the lower magnetic core 130; and the lower magnetic core 130 is axisymmetrical to the longitudinal direction (the B direction in FIG. 16 and the C direction in FIG. 20).

Figure 17:
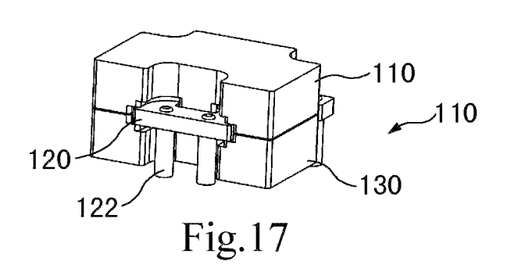
FIG. 17 is a schematic diagram of an inductor according to another embodiment of the present invention.
Figure 18:
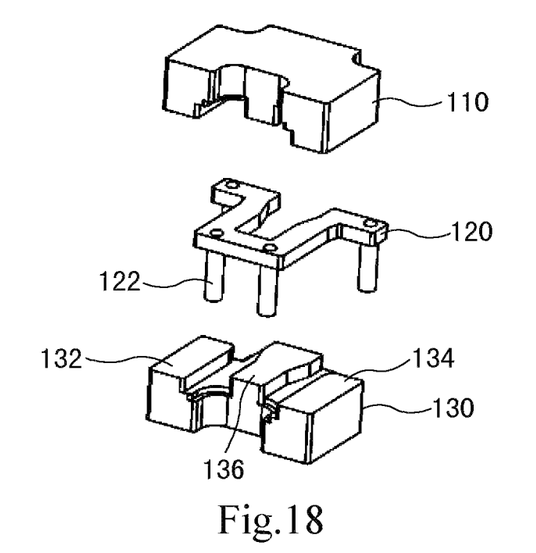
FIG. 18 is a schematic exploded view of the inductor according to the embodiment of the present invention.

FIGS. 17 and 18 are schematic diagrams of an inductor provided by another embodiment of the present invention. For the objective of briefness, the description the same with that of the above embodiment is omitted. Only the description of related parts different from that of the above embodiment is provided herein.

Figure 19:
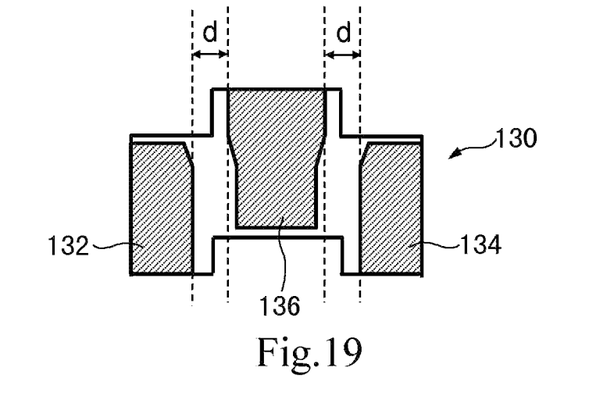
FIGS. 19 and 20 are schematic diagrams of a lower magnetic core according to the embodiment of the present invention.

The difference between the embodiment and the above embodiment is the different structure of the lower magnetic core 130. More specifically, as illustrated in FIGS. 19 and 20, the common magnetic column 136 in the embodiment is in the shape of a combination of a trapezoid and a rectangle, and the area of the common magnetic column 136 is bigger than that of the first winding column 132 or the second winding column 134. The lower magnetic core 130 is also set to be a Y-shaped magnetic core. Therefore, the deviation between the inductance value of the inductor formed by the first winding column 132, the first air gap, the common magnetic column 136, the upper and lower magnetic covers and one of the windings (the a1, b1 winding in FIG. 20) of the PCB winding board and the inductance of the inductor value formed by the second winding column 134, the second air gap, the common magnetic column 136, the upper and lower magnetic covers and the other winding (the a2, b2 winding in FIG. 20) of the PCB winding board may be controlled to be less than 10%, and preferably, may be controlled to be 4% to 7%. More preferably, the inductance value of the first inductor may be equal to that of the second inductor. As the common magnetic column 136 in the embodiment is in the shape of the combination of the trapezoid and the rectangle, the common magnetic column 136 can provide stable support for the upper magnetic core 110, so that the height of the first air gap formed between the first winding column 132 and the upper magnetic core 110 can be equal to the height of the second air gap formed between the second winding column 134 and the upper magnetic core 110, and hence the uniform current distribution of the two integrated inductors can be achieved, and consequently the stable operation of the power module can be guaranteed and the efficiency of the power module can be improved. Moreover, as illustrated in FIG. 19, along the transverse direction (the direction perpendicular to the longitudinal direction shown by C in FIG. 20) of the lower magnetic core 130, a predetermined distance d is formed between the common magnetic column 136 and the first winding column 132 and the second winding column 134. Preferably, the distance d is 1.2 mm, which is conducive to the passing of grinding equipment in the process of grinding the air gaps of the lower magnetic core 130.

Due to the special design of the lower magnetic core 130 cooperated with the pins 122, the deviation of the inductance value of the formed integrated inductors is controlled to be less than 10%, and preferably, may be controlled to be 4% to 7%. Meanwhile, as the elongated pins 122 can form the floating inductor 100, when the floating inductor 100 is integrated into the main board 200, a receiving space can be formed between the floating inductor 100 (more specifically, a bottom surface of the lower magnetic core 130 of the floating inductor 100) and an upper surface of the main board 200, so that the electronic components 210 on the main board 200 can be disposed in the receiving space. Therefore, the power module according to the application not only can obtain stable output but also can effectively utilize the space of the power module.

The common magnetic column 136 of the lower magnetic core according to the application may also adopt other shapes, for instance, a triangle, a rectangle, a round, a combination of a triangle and a rectangle, or other combinations. The application is intended to increase the area of the common magnetic column 136 intentionally so as to provide stable support for the upper magnetic core 110, and hence the seesaw phenomenon can be avoided and the possibility of the breakage of the common magnetic column 136 in the process of the assembly of the upper magnetic core with the lower magnetic core can be reduced dramatically. The upper magnetic core 110 may be I-shaped and may also adopt the same shape with that of the lower magnetic core.

Figure 21:
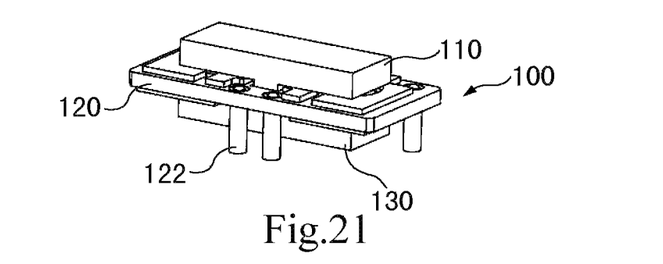
FIG. 21 is a schematic diagram of an inductor according to still another embodiment of the present invention.
Figure 22:
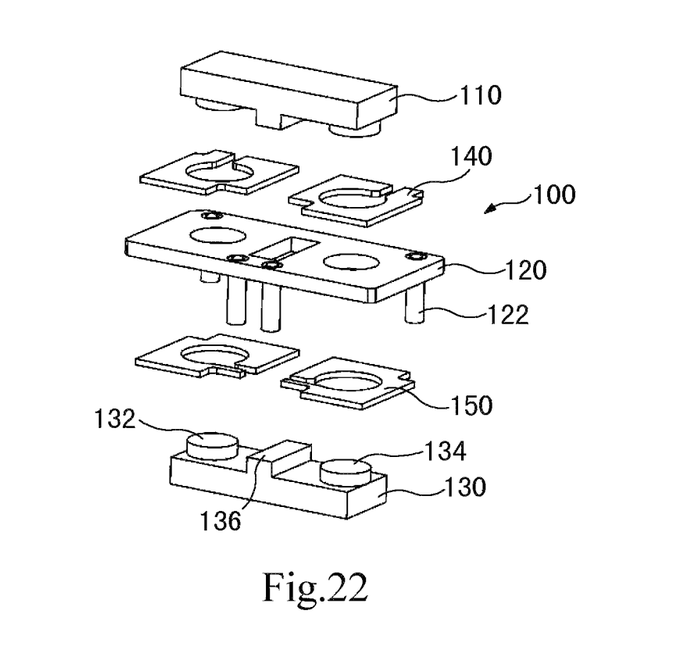
FIG. 22 is a schematic exploded view of the inductor according to the embodiment of the present invention.

FIGS. 21 and 22 illustrate a floating inductor 100 provided by another embodiment of the application. As illustrated in FIG. 22, an upper magnetic core 110, an upper surface mounted copper 140 and a PCB winding board 120, a lower surface mounted copper 150 and a lower magnetic core 130 are disposed from the top down in sequence. The PCB winding board 120 includes four independent metal pins 122. When the resistance and the wire loss of the winding are acceptable, the upper surface mounted copper 140 and the lower surface mounted copper 150 can also be eliminated. As shown in the figure, the lower magnetic core 130 in the embodiment is an E-shaped magnetic core; at least one pin among the four independent metal pins 122 is extended downwards from the PCB winding board and exceeds the bottom surface of the lower magnetic core 130. Therefore, the integrated inductor is a floating inductor, and hence a receiving space is formed between the bottom surface of the lower magnetic core 130 of the inductor and the main board to be connected, and the size of the receiving space can be adjusted by the adjustment of the length of the pin 122.

As illustrated in FIG. 22, the common magnetic column 136 of the lower magnetic core 130 in the embodiment is rectangular, and the area of the common magnetic column 136 is bigger than that of the cylindrical first winding column 132 or the cylindrical second winding column 134 on both sides. The lower magnetic core 130 is an E-shaped magnetic core. In the magnetic-core structure of the embodiment, the deviation between the inductance value of the inductor formed by the first winding column 132, the first air gap, the common magnetic column 136, the upper and lower magnetic covers and one of the windings of the PCB winding board and the inductance value of the inductor formed by the second winding column 134, the second air gap, the common magnetic column 136, the upper and lower magnetic covers and the other winding of the PCB winding board may be controlled to be less than 10%, and preferably, may be controlled to be 4% to 7%. More preferably, the inductance value of the first inductor may be equal to that of the second inductor. The area of the common magnetic column 136 in the embodiment is bigger than that of the winding columns on both sides, so that the common magnetic column 136 can provide stable support for the upper magnetic core 110 and the height of the first air gap formed between the first winding column 132 and the upper magnetic core 110 can be equal to the height of the second air gap formed between the second winding column 134 and the upper magnetic core 110, and hence the uniform current distribution of the two integrated inductors can be achieved, and consequently the stable operation of the power module can be guaranteed and the efficiency of the power module can be improved.

In the embodiment, the area of the first winding column is set to be equal to that of the second winding column; the height of the first air gap is equal to that of the second air gap; and the inductance value of the first inductor is equal to that of the second inductor. The words "equal to" and "equal" do not indicate absolute equality. As for those skilled in the art, a little deviation also falls within the scope of protection of the application. For instance, the deviation may be 20%. Preferably, the deviation may be 10%. More preferably, the deviation may be 5%.

Description has been given to the above embodiments by taking the PCB winding board and the specified structure of the lower magnetic core as an example, but the structure of the floating inductor and the structure of the magnetic core of the application are obviously not limited. The magnetic core may be a magnetic core in any shape. An integrated inductor structure may be adopted and a magnetic-core structure of a single inductor may also be adopted, as long as at least one pin connected to the PCB winding board is extended downwards and exceeds the bottom surface of the lower magnetic core to form a receiving space between the inductor and the main board to be connected. As for the magnetic element, the winding of the application is also not limited to the PCB winding board and may adopt, for instance, a litz wire, a precut copper coil or a copper strip as the winding. The upper magnetic core may adopt a magnetic-core structure symmetrical with that of the lower magnetic core and may also adopt an I-shaped magnetic sheet. Moreover, description has also been given to the above embodiment by taking the POL power module as an example. The power module of the application may also be applied to a non-POL power module.

The power module according to one embodiment can provide at least two independent power outputs and may also provide high-power output in in-phase or interleaved parallel connection. In addition, due to the new decoupled integrated floating inductor design, the objectives of miniaturization and high power density of the power module can be achieved and the optimal layout of other components can be conveniently realized. Moreover, according to the application, the assembly of the upper magnetic core and the lower magnetic core can be more stable, and hence the deviation of the inductance value of various integrated inductors can be basically eliminated.

It should be obvious to those skilled in the art that various modifications and deformations made to the present invention should not depart from the spirit or scope of the present invention. Therefore, the present invention aims to cover the modifications or deformations of the present invention as long as the modifications and deformations fall within the scope of the appended claims or equivalent replacements thereof.

What is claimed is:

1. A power module, comprising an inductor and a main board, wherein the inductor is disposed on the main board and includes an upper magnetic core, a printed circuit board (PCB) winding board, pins and a lower magnetic core; the PCB winding board is disposed between the upper magnetic core and the lower magnetic core; first ends of the pins are connected to the PCB winding board; and a second end, opposite to the first end, of at least one pin is extended and exceeds a bottom surface of the lower magnetic core and is connected to the main board, so that a receiving space is formed between the bottom surface of the lower magnetic core and an upper surface of the main board, wherein the lower magnetic core includes a first winding column, a second winding column and a common magnetic column disposed between the first winding column and the second winding column, wherein the PCB winding board includes a first winding and a second winding; the first winding is disposed on the first winding column to form a first inductor; the second winding is disposed on the second winding column to form a second inductor.

2. The power module according to claim 1, wherein the PCB winding board is parallel to the main board.

3. The power module according to claim 1, wherein blind holes or through holes are formed in the PCB winding board; and the first ends of the pins are disposed in the blind holes or the through holes of the PCB winding board.

4. The power module according to claim 1, wherein the first ends of the pins are surface mounted on the PCB winding board.

5. The power module according to claim 3, wherein blind holes or through holes are formed in the main board; and the second ends of the pins are disposed in the blind holes or the through holes of the main board.

6. The power module according to claim 4, wherein blind holes or through holes are formed in the main board; and the second ends of the pins are disposed in the blind holes or the through holes of the main board.

7. The power module according to claim 3, wherein the second ends of the pins are surface mounted on the main board.

8. The power module according to claim 4, wherein the second ends of the pins are surface mounted on the main board.

9. The power module according to claim 1, wherein the common magnetic column is in the shape of a triangle, a trapezoid, a rectangle, a round, a combination of a trapezoid and a rectangle, a combination of a triangle and a rectangle, or other combinations.

10. The power module according to claim 9, wherein a first air gap is formed between the first winding column and the upper magnetic core; a second air gap is formed between the second winding column and the upper magnetic core; and the height of the first air gap is equal to that of the second air gap.

11. The power module according to claim 9, wherein the area of the common magnetic column is bigger than that of the first winding column or that of the second winding column.

12. The power module according to claim 9, wherein the area of the first winding column is equal to that of the second winding column.

13. The power module according to claim 9, wherein the deviation between the inductance value of the first inductor and the inductance value of the second inductor is less than 10%.

14. The power module according to claim 13, wherein the deviation is 4% to 7%.

15. A power module, comprising an inductor and a main board, wherein the inductor is disposed on the main board and includes an upper magnetic core, a printed circuit board (PCB) winding board, pins and a lower magnetic core; the PCB winding board is disposed between the upper magnetic core and the lower magnetic core; first ends of the pins are connected to the PCB winding board; and a second end, opposite to the first end, of at least one pin is extended and exceeds a bottom surface of the lower magnetic core and is connected to the main board, so that a receiving space is formed between the bottom surface of the lower magnetic core and an upper surface of the main board, wherein the lower magnetic core includes a first winding column, a second winding column and a common magnetic column disposed between the first winding column and the second winding column, wherein along the longitudinal direction of a magnetic core, the common magnetic column is disposed on one side of the longitudinal direction; the first winding column and the second winding column are disposed on the opposite other side of the longitudinal direction; and the magnetic core is axisymmetrical to the longitudinal direction.

\* \* \* \* \*